(12) United States Patent
Dieker et al.

(10) Patent No.: US 9,234,650 B2
(45) Date of Patent: Jan. 12, 2016

(54) ASYMMETRIC AREA LIGHTING LENS

(71) Applicant: Universal Lighting Technologies, Inc., Madison, AL (US)

(72) Inventors: Henning Dieker, Madison, AL (US); John R. Householder, Cedar Park, TX (US)

(73) Assignee: Universal Lighting Technologies, Inc., Madison, AL (US)

( * ) Notice: Subject to any disclaimer, the term of this patent is extended or adjusted under 35 U.S.C. 154(b) by 166 days.

(21) Appl. No.: 13/917,349

(22) Filed: Jun. 13, 2013

(65) Prior Publication Data

US 2014/0016326 A1 Jan. 16, 2014

Related U.S. Application Data

(60) Provisional application No. 61/659,828, filed on Jun. 14, 2012.

(51) Int. Cl.
| | |
|---|---|
| *F21V 5/00* | (2015.01) |
| *F21V 13/04* | (2006.01) |
| *F21K 99/00* | (2010.01) |
| *H01L 33/54* | (2010.01) |
| *H01L 33/60* | (2010.01) |
| *F21V 5/04* | (2006.01) |
| *F21V 7/00* | (2006.01) |
| *G02B 3/02* | (2006.01) |
| *F21Y 101/02* | (2006.01) |

(52) U.S. Cl.
CPC . *F21V 13/04* (2013.01); *F21K 9/50* (2013.01); *F21V 5/04* (2013.01); *F21V 7/0091* (2013.01); *H01L 33/54* (2013.01); *H01L 33/60* (2013.01); *F21Y 2101/02* (2013.01); *G02B 3/02* (2013.01)

(58) Field of Classification Search
CPC ............. F21V 5/04; F21V 5/045; F21V 5/08; F21V 7/0091; F21V 13/04; G02B 3/02; G02B 3/04; G02B 3/06; G02B 3/08; H01L 33/52; H01L 33/54; H01L 33/58; H01L 33/60
USPC ......... 362/520, 244, 326, 336, 308, 309, 268; 359/726–736
See application file for complete search history.

(56) References Cited

U.S. PATENT DOCUMENTS

| | | |
|---|---|---|
| 6,837,605 B2 | 1/2005 | Reill |
| 6,948,838 B2 | 9/2005 | Künstler |
| 7,618,163 B2 | 11/2009 | Wilcox |

(Continued)

*Primary Examiner* — Peggy Neils
*Assistant Examiner* — Alexander Garlen
(74) *Attorney, Agent, or Firm* — Patterson Intellectual Property Law, P.C.; Mark J. Patterson; Jerry Turner Sewell

(57) ABSTRACT

A lens for distributing light from a light emitter in a desired asymmetric illumination profile includes a lens body having an input side and an output side. The input side receives light from an emitter, and the output side includes a major total internal reflection surface and a refractive surface. A primary emission axis associated with the emitter is defined through the lens body, and a transverse reference plane is positioned parallel to the primary emission axis. A desired illumination region is located on a first side of the reference plane, and a desired dark region is located on a second side of the reference plane. In some embodiments, the total internal reflection surface is entirely positioned on the second side of the reference plane. In additional embodiments, the total internal reflection surface includes a plurality of substantially planar adjacent longitudinal faces.

12 Claims, 8 Drawing Sheets

(56) References Cited

U.S. PATENT DOCUMENTS

| | | |
|---|---|---|
| 7,841,750 B2 | 11/2010 | Wilcox et al. |
| 7,942,559 B2 | 5/2011 | Holder et al. |
| 2010/0014290 A1* | 1/2010 | Wilcox .................. 362/244 |
| 2010/0172135 A1* | 7/2010 | Holder et al. ........... 362/249.14 |
| 2010/0195330 A1* | 8/2010 | Schaefer et al. ............. 362/237 |
| 2010/0296283 A1 | 11/2010 | Taskar et al. |
| 2010/0302786 A1* | 12/2010 | Wilcox et al. .................. 362/327 |
| 2011/0038151 A1* | 2/2011 | Carraher et al. .............. 362/242 |
| 2011/0063857 A1* | 3/2011 | Li et al. ......................... 362/336 |
| 2011/0242807 A1 | 10/2011 | Little, Jr. et al. |
| 2012/0307495 A1* | 12/2012 | Shih ............................. 362/237 |
| 2014/0085905 A1* | 3/2014 | Broughton ................... 362/310 |

* cited by examiner

ASYMMETRIC AREA LIGHTING LENS

CROSS-REFERENCE TO RELATED APPLICATION

This application claims benefit of U.S. Provisional Patent Application Ser. No. 61/659,828 filed Jun. 14, 2012 entitled Asymmetric Area Lighting Lens with Improved Uniformity, which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable.

REFERENCE TO SEQUENCE LISTING OR COMPUTER PROGRAM LISTING APPENDIX

Not Applicable.

BACKGROUND OF THE INVENTION

The present invention relates generally to lighting products and more particularly to optical lens devices, lighting systems, and associated methods for asymmetrically distributing light into an environment.

Conventional lighting products for illuminating environments typically include a light emitter such as a bulb or light emitting diode (LED) and a lens. Light emitted by the emitter is distributed in a desired pattern into the environment by the lens. In many applications, it is generally desirable to emit light in an asymmetric profile such that more light is distributed by the lens into a desired direction, and less light is distributed into non-preferred directions. Such applications for asymmetric lighting include street lighting where it is desirable to maximize the amount of light projected toward the street, but to minimize the amount of light projected away from the street toward nearby houses or buildings. Numerous other applications where asymmetric lighting profiles are desired from emitter and lens combinations are generally known in the art for both indoor and outdoor applications.

Asymmetric light distribution may be achieved in a variety of ways. For example, conventional devices for projecting light in a given direction include mechanical reflectors or shields that intercept light rays and redirect those light rays in a desired direction. Reflectors often have a polished surface to improve surface reflectivity to more efficiently reflect incident light. However, reflectors are often inadequate for many asymmetric lighting applications because they absorb photons and reduce lighting efficiency. Additionally, reflectors may become hot during use or may become damaged or misaligned, resulting in uneven light distribution profiles. Reflectors also may be expensive to produce and align in a mass production environment.

Others have attempted to overcome the problems of efficiently distributing emitted light in an asymmetric profile by providing a shaped lens over an emitter. The shaped lens may include a transparent or semi-transparent material having one or more exterior refractive surfaces. Emitted light travels through the lens material and is redirected in a desired direction upon contact with the exterior refractive surface. For example, U.S. Pat. No. 7,618,163 teaches a lens for covering an LED apparatus for illumination toward a preferential side utilizing a refractive outer surface. Similarly, U.S. Pat. No. 6,837,605 teaches illumination optics for asymmetrically refracting light transmitted through the optic.

One problem with conventional asymmetric lens devices is the use of primarily refractive exterior surfaces for distributing light asymmetrically. The use of refractive surfaces for the majority of light control often requires additional mechanical shields or reflectors to block light inadvertently distributed toward the desired dark region, or house side, of a lighting system. As such, conventional systems may require two components—a primarily refractive lens and a mechanical shield or reflector—for achieving satisfactory asymmetric light distribution. Additionally, conventional asymmetric lens devices do not achieve optimal efficiency and do not minimize unwanted light emission toward the desired dark regions.

What is needed, then, are improvements in asymmetric area lighting devices, optical lenses and associated methods.

SUMMARY OF THE INVENTION

An object of the present invention is to provide a lens for covering a light emitter and for providing an asymmetric light distribution over an illumination region. The lens includes a base having an input side into which light from the emitter is incident and an output side from which transmitted light is emitted from the lens. The output side includes a total internal reflection (TIR) surface configured to reflect light incident on that surface toward a desired illumination region.

Another embodiment of the present invention provides an optical lens apparatus for distributing light from a light emitter. The apparatus includes a lens body having an input side and an output side. The lens body includes a primary refractive output surface positioned on the output side and a total internal reflection surface positioned on the output side.

In a further embodiment, the present invention provides an optical lens apparatus for asymmetrically distributing light from an emitter toward a desired illumination region and away from a desired dark region. The apparatus includes a lens body having an input side and an output side. A primary emission axis extends through the lens body from the input side to the output side. The primary emission axis is associated with the principal illumination direction of the emitter. A total internal reflection surface is disposed on the lens body. The total internal reflection surface is configured to reflect all transmitted light incident on the total internal reflection surface toward the desired illumination region.

Another embodiment of the present invention provides a lighting apparatus for distributing light asymmetrically into an environment toward a desired illumination region and away from a desired dark region. The apparatus includes an emitter and an optical lens positioned on the emitter. The optical lens includes a total internal reflection surface and a refractive surface, wherein the total internal reflection surface is configured to reflect all light incident on the total internal reflection surface toward the desired illumination region.

A further object of the present invention is to provide an optical lens for asymmetrically distributing light in a street lighting application.

Another object of the present invention is to provide a wide area light distribution from a light source, such as a light emitting diode (LED), to provide a uniform lit area with efficient projection into a specified region.

Yet another object of the present invention is to provide an optical lens wherein a majority of light emitted in one half-hemisphere field of view of an associated emitter is incident on a totally internally reflective surface.

Another object of the present invention is to provide an optical lens wherein all light emitted in one half-hemisphere field of view of an associated emitter is incident on a totally internally reflective surface.

A further object of the present invention is to provide a lighting package with an emitter and a lens for asymmetrically distributing light toward a desired illumination region.

Yet another object of the present invention is to provide an optical lens that can be manufactured in a straight-pull injection molding tooling system.

Numerous other objects, features and advantages of the present invention will be readily apparent to those skilled in the art upon a reading of the following disclosure when taken in conjunction with the accompanying drawings.

DETAILED DESCRIPTION OF THE INVENTION

Figure 1:
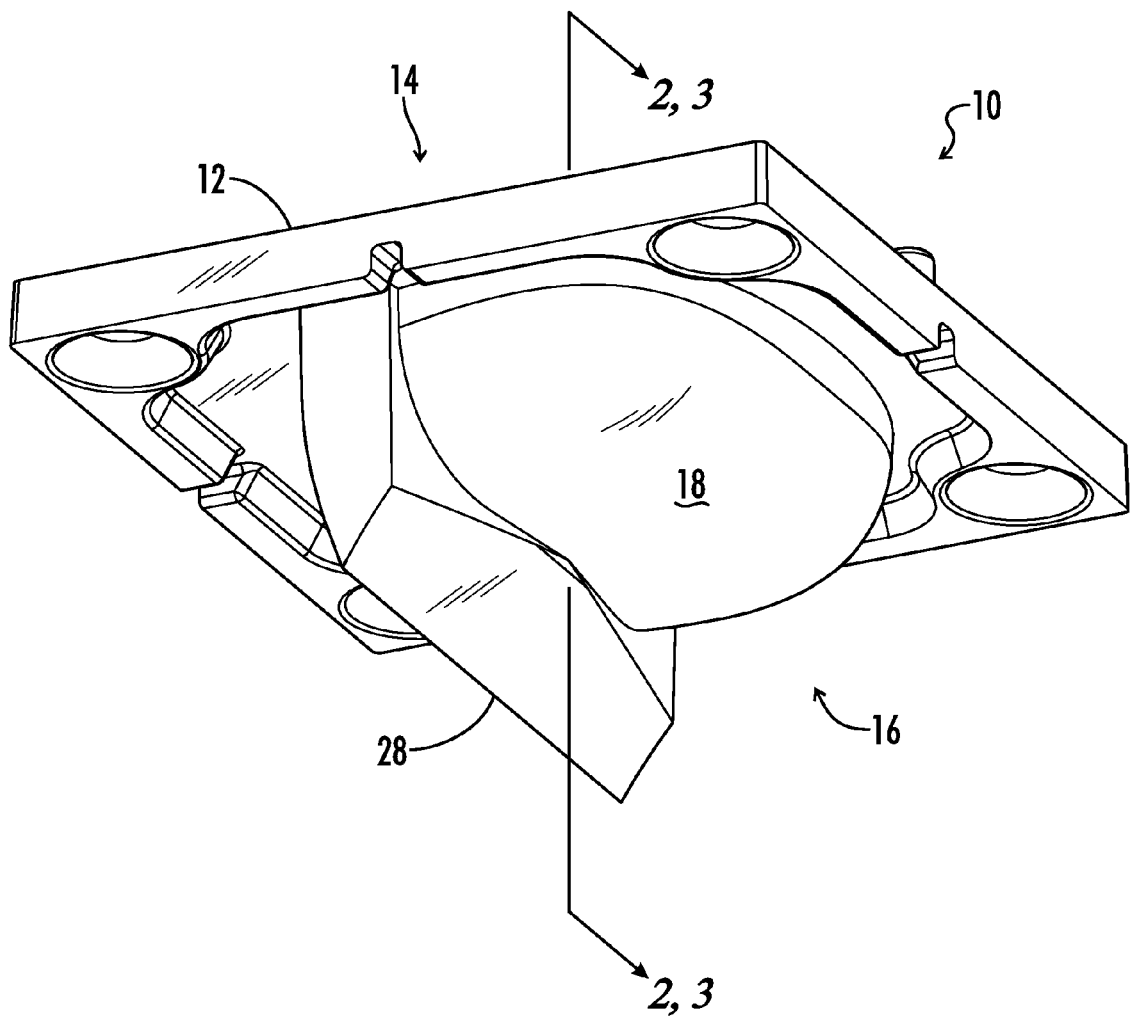
FIG. 1 illustrates a perspective view of an embodiment of a lens apparatus in accordance with the present invention.

Referring now to the drawings, FIG. 1 illustrates an embodiment of an optical lens apparatus for asymmetrically distributing light in an area. The lens apparatus is generally configured to be positioned on or near a light emitter such as a lamp, bulb, light emitting diode (LED) or other suitable light emitter. The lens apparatus includes a lens body 10 having an input side 14 and an output side 16. The input side 14 includes the side where the light source is placed. In some embodiments, an emitter recess 22 is defined on the input side 14 of lens body 10. Emitter recess 22 provides a region for placement of a light emitter such as an LED package, a lamp or a bulb. In alternative embodiments, a light emitter may be placed against or near input side 14 without any emitter recess 22 present.

Lens body 10 may be used with a light emitter in various applications, such as overhead lighting, street lighting, vehicle lighting, indoor lighting, outdoor lighting, or other lighting applications requiring asymmetric light distribution.

Output side 16 generally includes the side of lens body 10 from which light is distributed into an environment. Output side 16 may have a complex geometric shape to provide a desired illumination pattern. As seen in FIG. 1, in some embodiments, output side 16 is configured to produce an asymmetrical distribution of light. A base 12 may be located on input side 14 in some applications. Base 12 provides a structure for lens body 10 to be mounted to a substrate or lighting fixture. Base 12 can be configured in any suitable geometry for engaging a corresponding substrate or mount.

Figure 2:
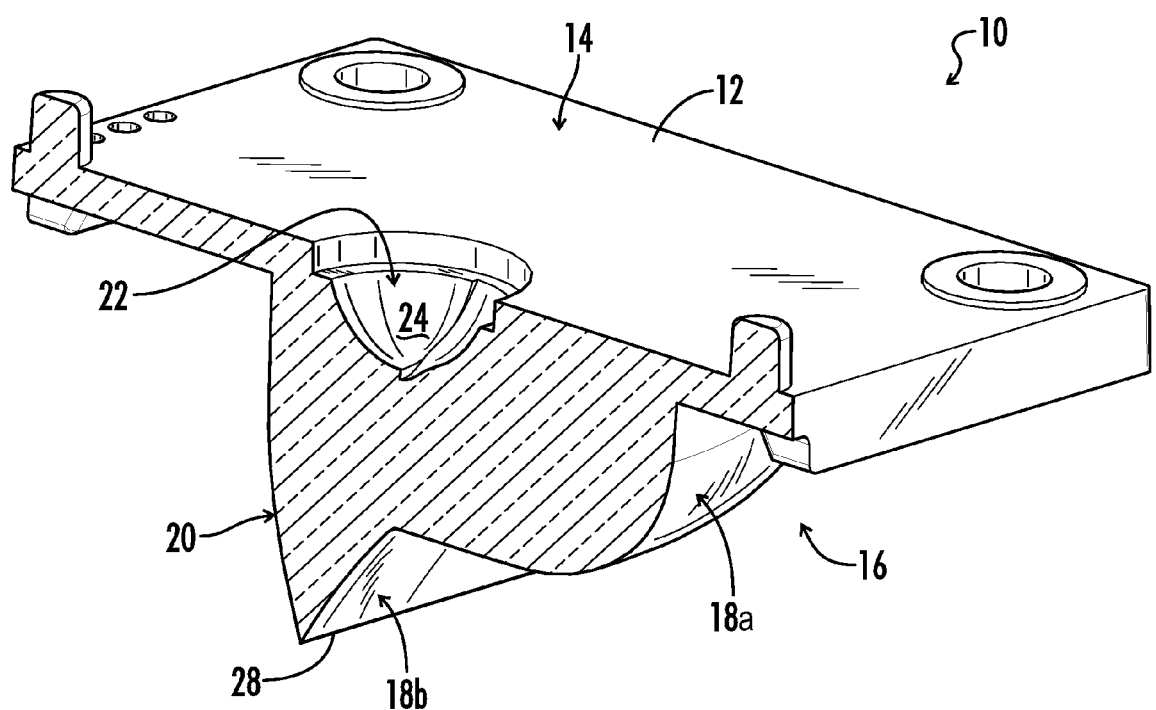
FIG. 2 illustrates a perspective cross-sectional view of the embodiment of a lens apparatus from Section 2-2 of FIG. 1.

Referring to FIG. 2, output side 16 includes at least two primary lens features in some embodiments. A convex refractive surface 18 is positioned on output side 16. Convex refractive surface 18 may include a primary refractive surface 18a and a secondary refractive surface 18b. Light transmitted through lens body 10 from an emitter toward refractive surface 18 will be distributed away from refractive surface 18 at an angle. Refractive surface 18 may have a convex or dome shape to distribute refracted light into a desired area away from lens body 10 in some embodiments.

Figure 3:
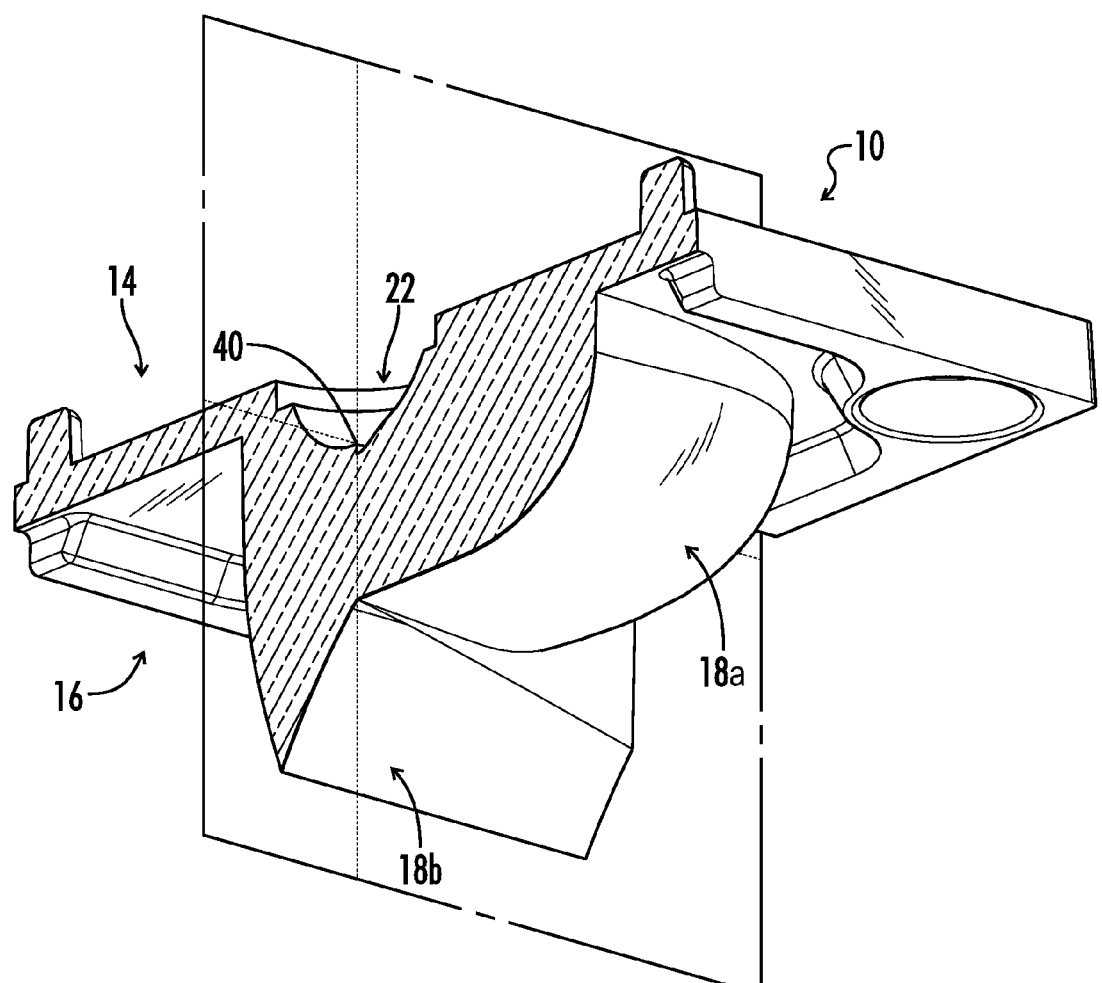
FIG. 3 illustrates a perspective cross-sectional view of the embodiment of a lens apparatus from Section 3-3 of FIG. 1.

Additionally, a protruding lens region forming a fin 28 projects from base 12 adjacent refractive surface 18. Fin 28 generally has a height relative to base 12 that is greater than the height of refractive surface 18. Fin 28 includes a knife-edge lower corner in some embodiments, as seen in FIG. 2 and FIG. 3. Fin 28 includes a total internal reflection surface 20 facing generally away from refractive surface 18 in some embodiments. A total internal reflection (TIR) surface 20 may be described as a surface from which light is reflected internally but not refracted outwardly. For example, a total internal reflection (TIR) surface 20 on lens body 10 would provide internal reflection of light transmitted to the surface without also refracting light outwardly away from the same surface.

Figure 4A:
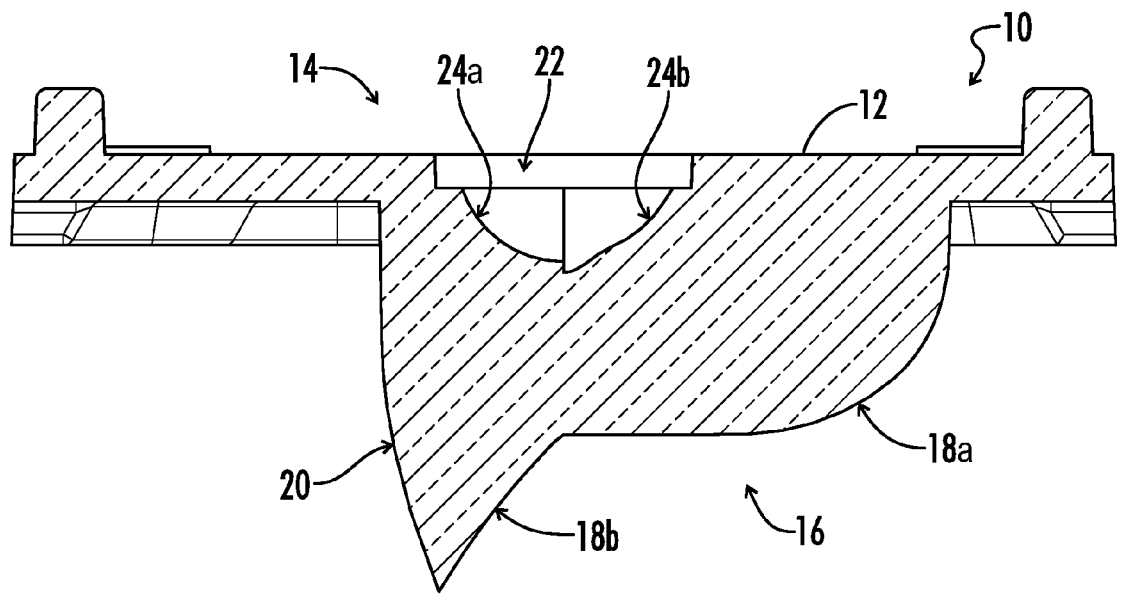
FIG. 4A illustrates a partial cross-sectional view of the embodiment of a lens apparatus of FIG. 1 showing an emitter recess in accordance with the present invention.
Figure 4B:
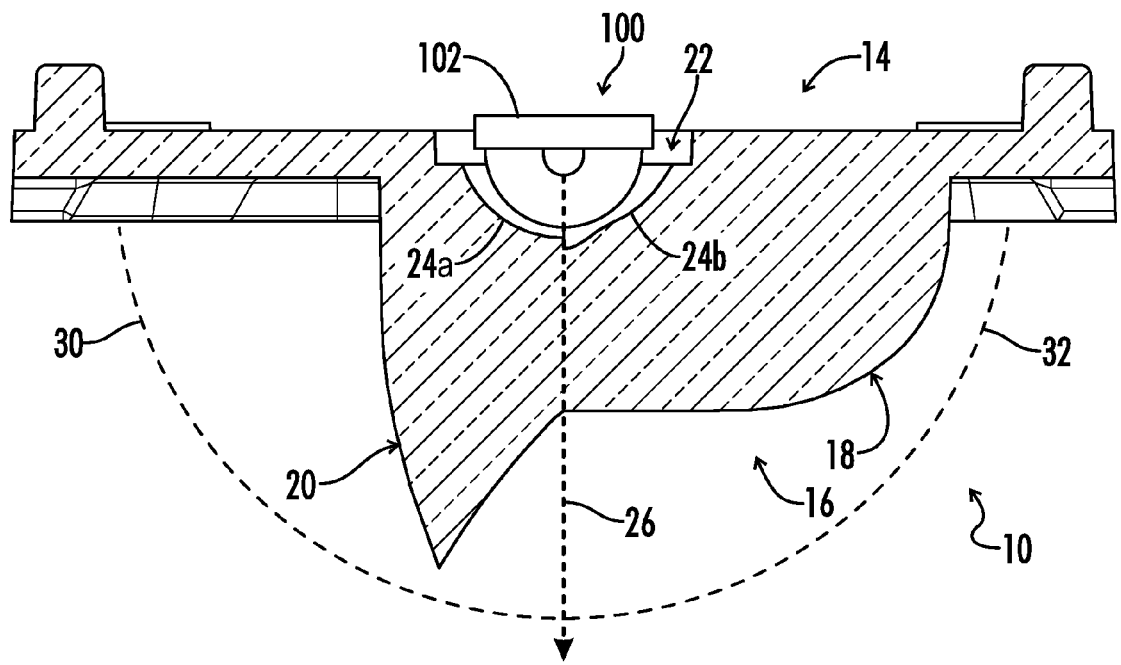
FIG. 4B illustrates a partial cross-sectional view of the embodiment of a lens apparatus of FIG. 1 including a light emitter positioned in the emitter recess in accordance with the present invention.

In some embodiments, lens body 10 includes a primary emission axis 26, seen in FIG. 4B, associated with an emitter when the emitter is installed in the emitter recess 22 or near the input side. For example, an LED or LED package 100 positioned in emitter recess 22 may have a primary emission axis 26 oriented substantially normal to the LED substrate 102. Lens body 10 is positioned over the LED package 100 such that at least a portion of the LED package is received in emitter recess 22. As such, primary emission axis 26 is oriented through lens body 10 in the general direction of illumination. The emitter may have a predetermined light distribution profile based on the emitter properties. An LED may have an axisymmetric light distribution profile generally having the shape of a hemisphere or a portion of a hemisphere.

Various regions in the field of view of the emitter and lens may be defined to aid identification of desired illumination and desired dark regions for asymmetric lighting applications. For example, an emitter may illuminate different regions or sectors of space, and in asymmetric lighting applications it is desirable to determine which sectors are to be illuminated.

A reference plane may be used to identify sectors of space for asymmetric lighting. Lens body 10 may include a transverse reference plane extending through the lens body, shown generally in FIG. 3. A region on a first side of the reference plane may be a desired illumination region, and a region on the second side of the reference plane may be a desired dark region. In some asymmetric lighting applications, such as street lighting, it is desirable to provide maximum illumination on the first side of the reference plane and a minimum amount of illumination on the second side of the reference plane. The transverse reference plane may be coextensive with the primary emission axis 26 in some embodiments. Alternatively, the transverse reference plane may also be offset from the primary emission axis 26 a predetermined distance to either side. A desired illumination region 32 is located on a first side of the reference plane. The desired illumination region 32 includes a region of space in the field of view of the lens body 10 that is desired to receive more illumination. This could include a street or sidewalk in a street lighting application. Additionally, a desired dark region 30 is located on the second side of the reference plane opposite the desired illumination region 32. The desired dark region 30 includes a portion of the field of view of the lens body 10 for which less illumination is desired.

In some applications, it is desirable to distribute greater than 90% of light transmitted through lens body 10 into the desired illumination region 32 on the first side of the reference plane. In other applications it is desirable to distribute close to 100% of the light transmitted through lens body 10 into the desired illumination region 32. As such, lens 10 may be said to have an asymmetrical lighting profile whereby more light is transmitted via lens body 10 into the desired illumination region 32, and less light is transmitted via lens body 10 into the desired dark region 30.

Figure 4C:
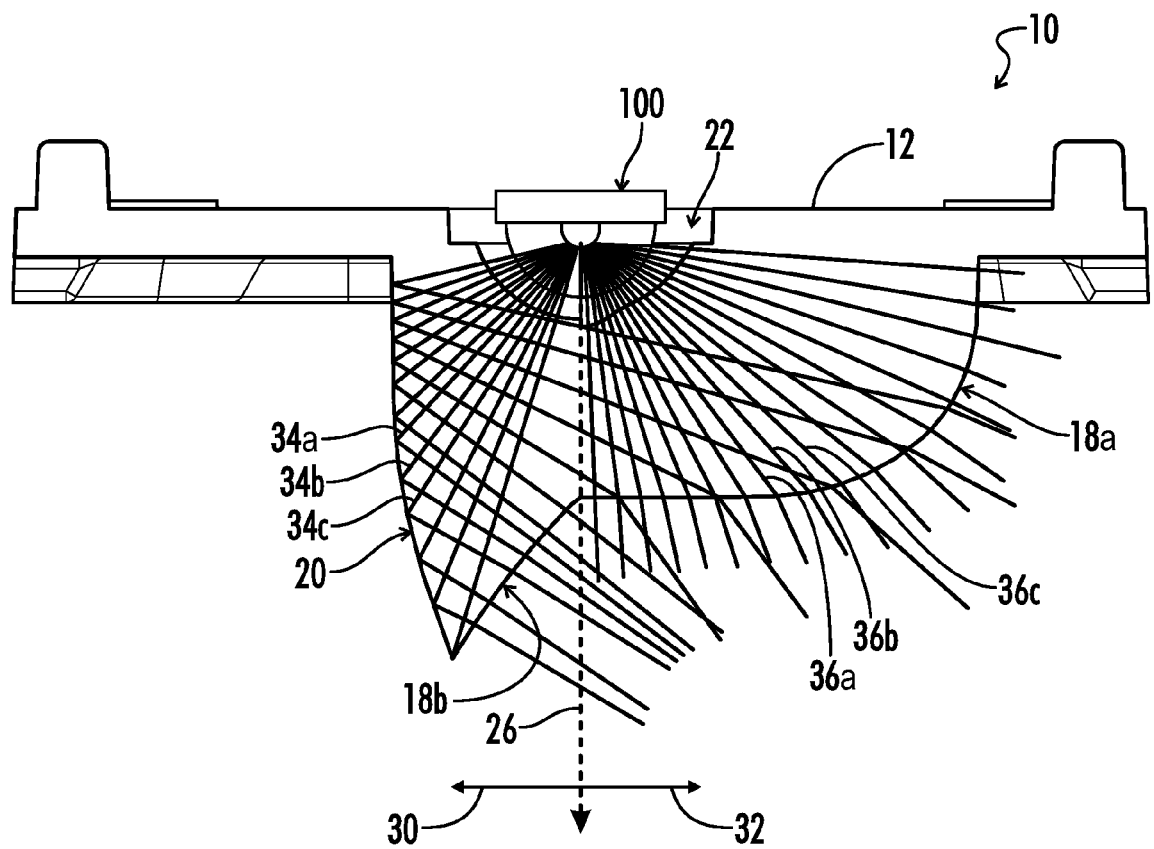
FIG. 4C illustrates a partial cross-sectional view of the embodiment of a lens apparatus of FIG. 1, further including light path lines showing internal reflection from the total internal reflection surface and refraction from the primary refraction surface in accordance with the present invention.

As seen in FIGS. 4B and 4C, in some embodiments, a desired dark region 30 includes a region of space on a second side of a reference plane passing through primary emission axis 26. Desired illumination region 32 includes a region of space on a first side of the reference plane passing through primary emission axis 26. In some embodiments, total internal reflection (TIR) surface 20 is positioned entirely in the desired dark region 30. As such, total internal reflection surface 20 may have at least two functions. First, total internal reflection surface 20 receives light transmitted through lens body 10 and reflects that light internally back toward the desired illumination region 32, or toward the street side in street lighting applications. Second, total internal reflection surface 20 provides a natural cut-off of light travelling toward the desired dark region 30, or house side in street lighting applications. For example, stray off-axis light may be cut-off or clipped by the total internal reflection surface 20 to prevent the light from entering the desired dark region 30.

Figure 6:
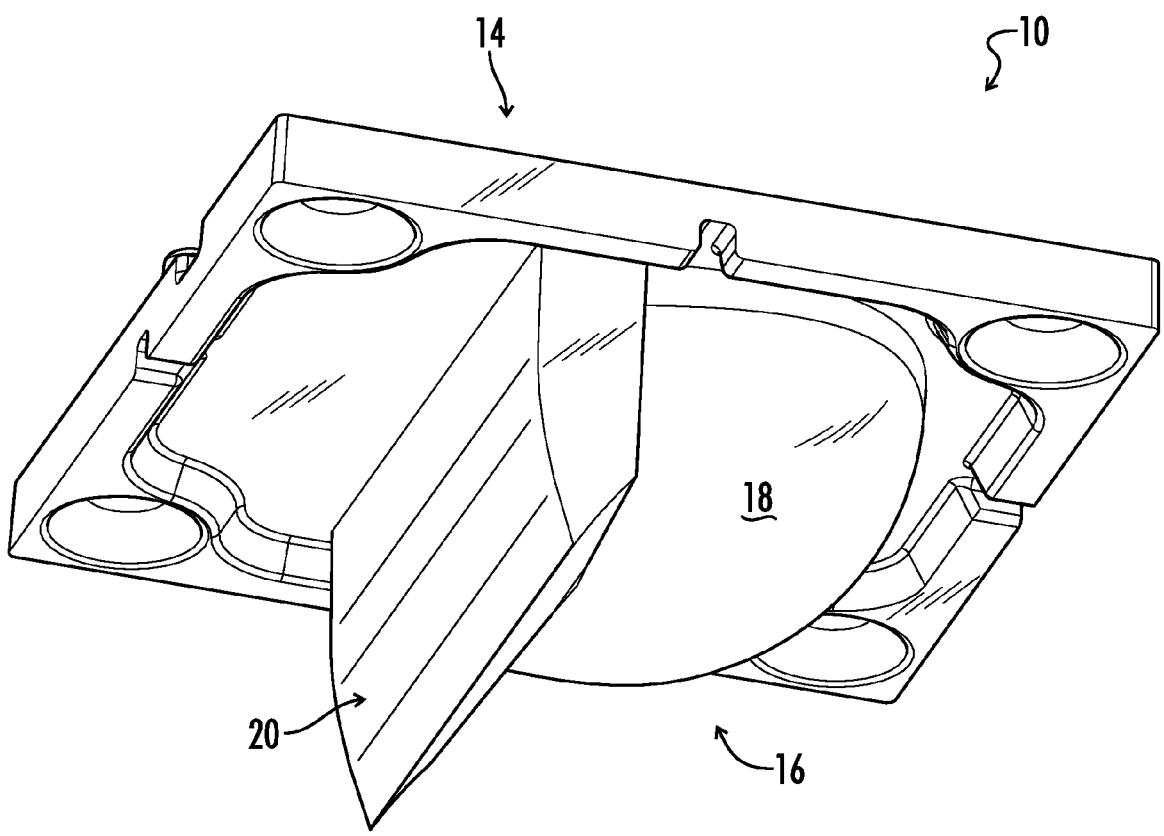
FIG. 6 illustrates a perspective view of an embodiment of a lens apparatus with a curved total internal reflection surface in accordance with the present invention.
Figure 7:
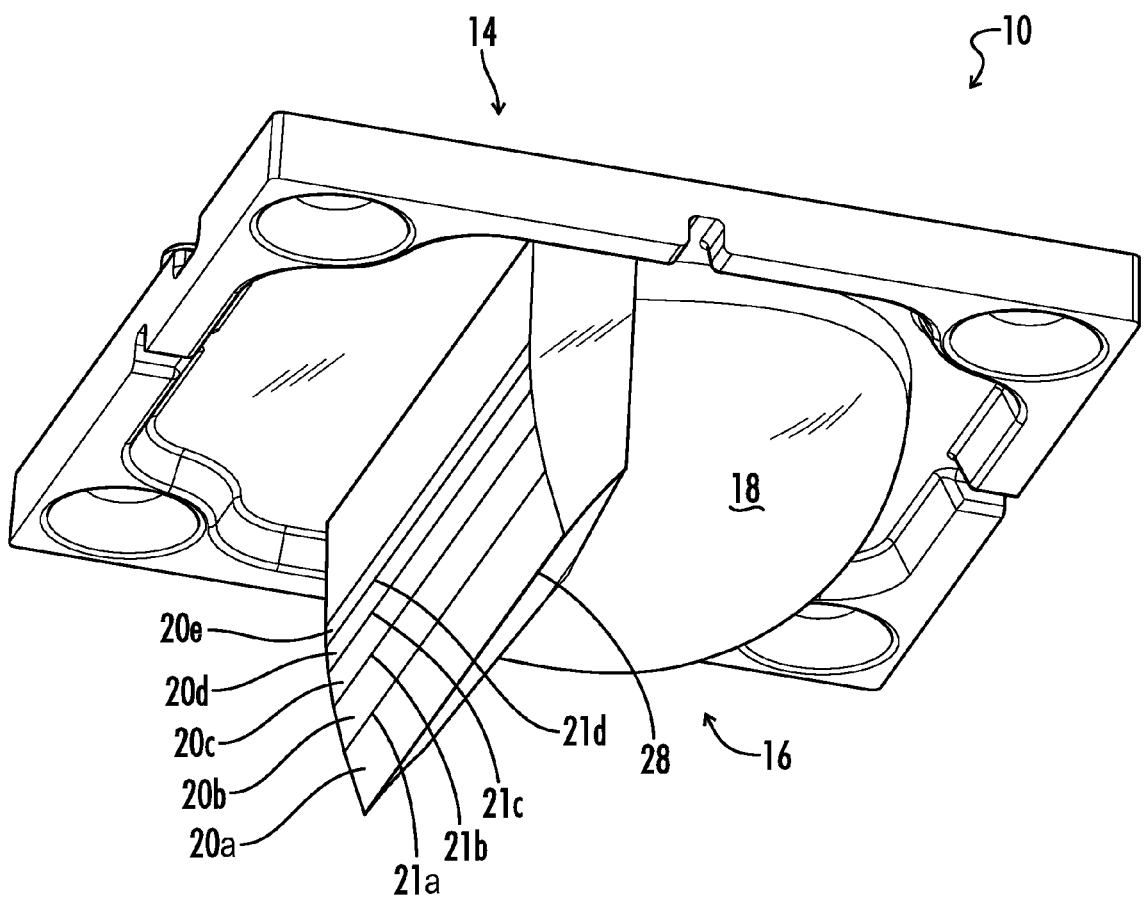
FIG. 7 illustrates a perspective view of an alternative embodiment of a lens apparatus with a plurality of adjacent planar faces on the total internal reflection surface in accordance with the present invention.

Total internal reflection surface 20 protrudes from base 12 in a substantially perpendicular orientation in some embodiments. As such, total internal reflection surface 20 includes a surface portion oriented substantially parallel to a transverse reference plane passing through primary emission axis 26. Total internal reflection surface 20 can have various configurations, as seen in FIG. 6 and FIG. 7. In a first embodiment shown in FIG. 6, total internal reflection surface 20 has a surface profile slightly curving toward primary emission axis 26 as the surface extends away from base 12. Total internal reflection surface 20 terminates at a lower edge of fin 28 adjacent an upwardly-extending secondary refractive surface 18b (FIG. 4). An acute angle is formed between total internal reflective surface 20 and secondary refractive surface 18b in some embodiments. This acute angle assists with allowing total internal reflective surface 20 and fin 28 to clip off-axis light travelling toward desired dark region 30.

Alternatively, as seen in FIG. 7, total internal reflection surface 20 in some embodiments includes a plurality of substantially planar adjacent longitudinal faces 20a, 20b, 20c, 20d, 20e, etc. Each longitudinal face is oriented at a slight angle relative to its adjacent faces, forming an overall convex surface profile curving slightly toward primary emission axis 26. Adjacent longitudinal faces 20a, 20b, 20c, 20d, 20e, etc. intersect at substantially parallel intersection axes 21a, 21b, 21c, 21d, etc. in some embodiments, as seen in FIG. 7. The longitudinal faces 20a, 20b, 20c, 20d, 20e, etc. collectively reflect transmitted light back toward the desired illumination region 32.

Total internal reflection surface 20 provides a major surface of outer side of lens body 10. As such, total internal reflection surface 20 receives a significant portion of light transmitted through lens body 10 initially toward the desired dark region 30. In some embodiments, total internal reflection surface 20 includes the majority of the surface area on the outer side of lens body 10 in the desired dark region 30 sector. In these embodiments, the surface area of total internal reflection surface 20 is greater than the surface area of secondary refractive surface 18a.

Referring further to FIG. 4C, light rays are illustrated to provide a visual representation of the path of light from an emitter 100 toward the desired illumination region 32, or street side in a street lighting application. Light rays emitted from emitter 10 generally travel through lens body 10 either toward total internal reflection surface 20 or toward refractive surface 18. In other words, light rays emitted from emitter 10 travel on either side of primary emission axis 26. For example, a first set of light rays 36a, 36b, 36c emitted toward a first side of primary emission axis 26 travels toward primary refractive surface 18a and are subsequently refracted into desired illumination region 32. A second set of light rays 34a, 34b, 34c emitted toward a second side of primary emission axis 26 travels toward total internal reflection surface 20 and are subsequently reflected back from total internal reflection surface 20 toward desired illumination region 32. Some off-axis light rays may also extend toward secondary refractive surface 18b on the second side of primary emission axis 26 and subsequently be refracted back toward desired illumination region 32 based on the shape and orientation of secondary refractive surface 18b, as well as the acute angle between total internal reflection surface 20 and secondary refractive surface 18b. The off-axis light rays may be clipped by the lower edge of total internal reflection surface 20 along the lower edge of fin 28. As shown in FIG. 4C, in some applications, total internal reflection surface 20 provides reflection of substantially all light incident on total internal reflection surface 20 back toward desired illumination area 32 in some applications. In additional embodiments, total internal reflection surface 20 provides reflection of a majority of light incident on total internal reflection surface 20 from emitter 100 back toward desired illumination region 32.

Figure 5:
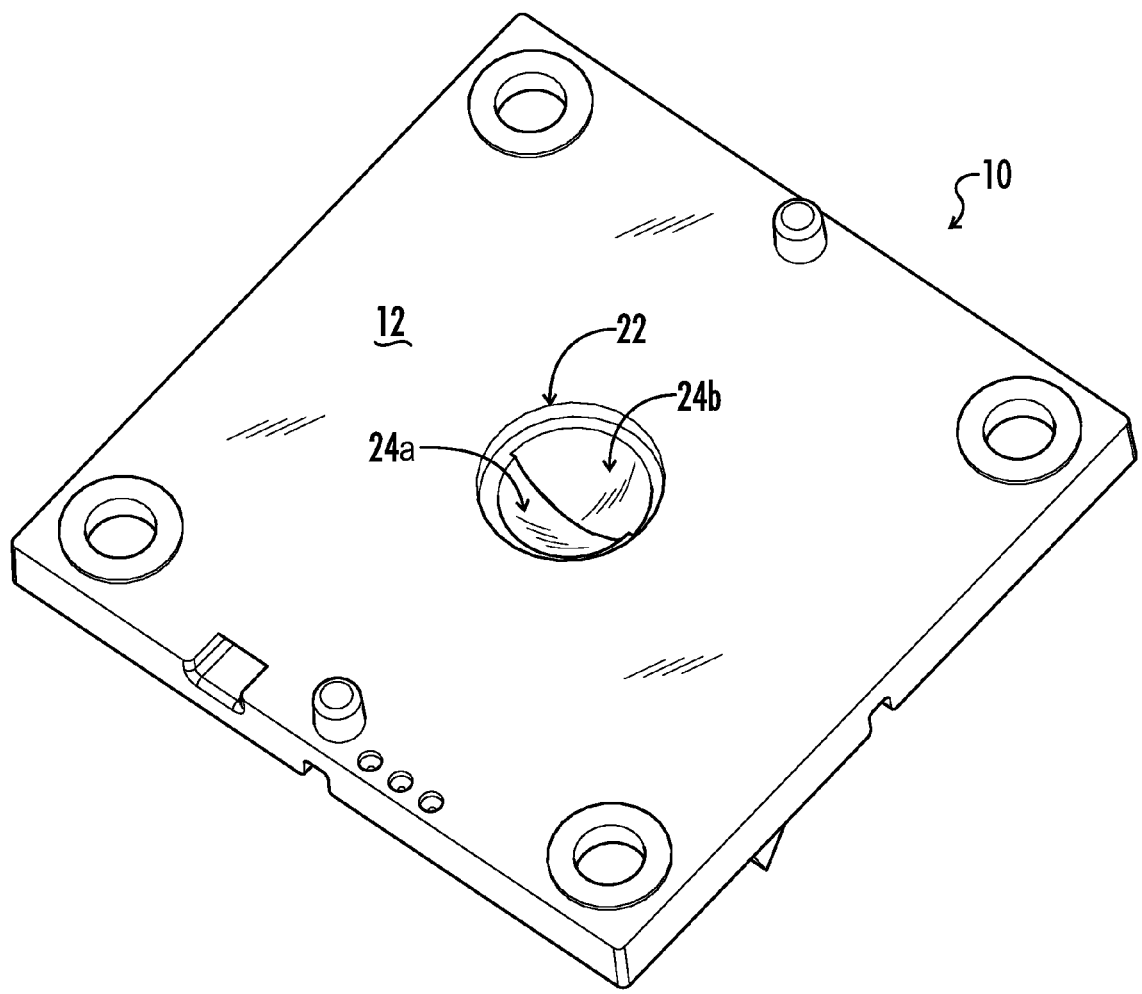
FIG. 5 illustrates a perspective view of a base of the embodiment of a lens apparatus of FIG. 1 in accordance with the present invention.

Referring to FIGS. 4A and 5, another feature of lens body 10 in some applications includes an emitter recess 22 having a substantially hemispherical profile. Emitter recess 22 may be shaped to correspond to an associated emitter or emitter package, such as an LED or LED package. Depending on the shape of the associated emitter, emitter recess 22 may take any suitable corresponding shape. An input surface 24 is defined in emitter recess 22. Input surface 24 provides a surface by which light rays emitted from emitter 100 can enter lens body 10. An optical power may be provided at input surface 24 to help reduce the work required by subsequent surfaces to control the light. As seen in FIG. 4A, the substantially hemispherical input profile of emitter recess 22 includes a first half-hemisphere region 24a having a first radius and a second half-hemisphere region 24b having a second radius. In some embodiments, the second radius is larger than the first radius. A ledge 40 (FIG. 3) may be defined between the first and second half-hemisphere regions 24a, 24b in some embodiments. Ledge 40 may be a perpendicular ledge in some embodiments, and input surface 24 on the interior of emitter recess 22 provides a refractive surface.

In alternative embodiments, an emitter may be positioned against or near input side 14 on base 12 without being inserted into emitter recess 22. In such embodiments, input side 14 of base 12 may be substantially smooth or uninterrupted.

In further embodiments, the present invention provides a method of forming an asymmetric lighting assembly. The method includes: (a) providing an optical lens with a totally internal reflection surface on the output side of the lens; and (b) positioning an emitter against the input side of the lens such that all light incident on the total internal reflection surface will be reflected toward the desired illumination area.

An additional embodiment of the present invention provides a method of illuminating a street, including: (a) providing an LED optic lens having a total internal reflection surface forming a dark side boundary in the field of view of an associated LED emitter; (b) projecting light into the lens from the LED; and (c) reflecting all light incident on the total internal reflection surface toward the desired illumination region.

Thus, although there have been described particular embodiments of the present invention of a new and useful Asymmetric Area Lighting Lens, it is not intended that such references be construed as limitations upon the scope of this invention except as set forth in the following claims.

What is claimed is:

1. An optical lens apparatus for distributing light from a light emitter, comprising:
    a lens body having an input side and an output side, the input side of the lens body positionable to receive light from the light emitter, the light from the light emitter including at least first and second portions of light, the first portion of light initially directed into a first region of the lens body and the second portion of light initially directed into a second region of the lens body, the first region and the second region separated by a transverse reference plane passing through the light emitter;
    a refractive output surface positioned on the output side of the first region of the lens body, the refractive output surface refracting the first portion of the light from the light emitter to direct and the first portion of the light to a desired illumination region; and
    a light redirecting fin positioned on the output side of the second region of the lens body, the light redirecting fin having a proximal end and a distal end, the distal end positioned farther from the input side of the lens body than the distal end, the light redirecting fin including a total internal reflection surface extending from the proximal end to the distal end of the light redirecting fin and spaced apart from the transverse reference plane, the light redirecting fin including a refracting surface, the refracting surface of the light redirecting fin extending at an acute angle from the distal end of the total internal reflection surface to an intersection with the transverse reference plane, the total internal reflection surface reflecting the second portion of the light from the light emitter to direct the second portion of the light toward the desired illumination region, at least a portion of the second portion of light reflected by the internal reflection surface passing through the second refracting surface of the light directing fin wherein the total internal reflection surface of the light redirecting fin is positioned at varying distances from the transverse reference plane such that a proximal portion of the total internal reflection surface is farther from the reference plane than a distal portion of the total internal reflecting surface; the total internal reflection surface comprises a plurality of planar longitudinal faces, each face having a proximal edge and a distal edge, each respective distal edge of a longitudinal face closer to the transverse reference plane than the respective proximal edge of the longitudinal face.

2. The apparatus of claim 1, further comprising:
    an emitter recess formed in the input side of the lens body;
    the lens body including a primary emission axis aligned with the emitter when the emitter is installed in the emitter recess; and
    the transverse reference plane extending through the primary emission axis the transverse reference plane having a first side and a second side, the first region of the lens body being on the first side of the transverse reference plane and the second region of the lens body being on the second side of the transverse reference plane;
    wherein:
        the desired illumination region is located on a first side of the reference plane, and wherein a desired dark region is located on the second side of the reference plane, and
        the total internal reflection surface of the light redirecting fin is positioned entirely in the desired dark region on the second side of the reference plane.

3. The apparatus of claim 2, further comprising the emitter recess having a substantially hemispherical profile.

4. The apparatus of claim 3, wherein the substantially hemispherical profile includes a first half-hemisphere region having a first radius and a second half-hemisphere region having a second radius, wherein the second radius is larger than the first radius.

5. The apparatus of claim 4, wherein the first half-hemisphere region and the second half-hemisphere region form a refractive input surface that receives light from the emitter when the emitter is positioned in the emitter recess.

6. The apparatus of claim 4, further comprising a perpendicular ledge between the first half-hemisphere region and the second half-hemisphere region in the emitter recess.

7. An optical lens apparatus for asymmetrically distributing light from an emitter toward a desired illumination region and away from a desired dark region, the apparatus comprising:
    a lens body having an input side and an output side;
    a reference plane extending through the lens body from the input side to the output side, the reference plane having a first side and a second side, the reference plane separating the lens body into a first lens body portion on the first side of the reference plane and a second lens body portion on the second side of the reference plane, and the desired dark region located on the second side of the reference plane; and
    a light redirecting fin located on the second lens body portion, the light redirecting fin including a proximal end nearer the input side of the lens body and a distal end displaced away from the lens body, the light redirecting fin including a total internal reflection surface spaced apart from the reference plane and extending from the proximal end to the distal end of the light redirecting fin, the light redirecting fin including a refracting surface extending at an acute angle from the distal end of the total internal reflecting surface to an intersection with the reference plane, the light redirecting fin configured to reflect transmitted light from the emitter incident on the total internal reflection surface into the desired illumination region on the first side of the reference plane, at least a portion of the transmitted light reflected from the total internal reflecting surface passing through the refracting surface of the light redirecting fin wherein the total internal reflection surface of the light redirecting fin is positioned at varying distances from the transverse reference plane such that a proximal portion of the total internal reflection surface is farther from the reference plane than a distal portion of the total internal reflecting surface; the total internal reflection surface comprises a plurality of planar longitudinal faces, each face having a proximal edge and a distal edge, each respective distal edge of a longitudinal face closer to the transverse reference plane than the respective proximal edge of the longitudinal face.

8. The apparatus of claim 7, wherein the refractive output surface on the output side of the first region of the lens body includes a convex profile.

9. The apparatus of claim 7, further comprising a primary emission axis aligned with the emitter and extending through the lens body, wherein the reference plane is parallel to the primary emission axis.

10. The apparatus of claim 9, wherein the reference plane is coextensive with the primary emission axis.

11. The apparatus of claim 10, wherein the reference plane is offset from the primary emission axis.

12. A lighting apparatus for distributing light asymmetrically into an environment toward a desired illumination region and away from a desired dark region, the apparatus comprising:
- an LED emitter having a primary emission axis; and
- an optical lens positioned on the emitter such that the primary emission axis extends through the optical lens, the optical lens having a transverse reference plane parallel to the primary emission axis, the transverse reference plane having a first side and a second side, the optical lens including a light redirecting fin on the second side of the transverse reference plane and including a primary refractive surface on the first side of the transverse reference plane, the light redirecting fin having a proximal end nearer the LED emitter and having a distal end farther away from the LED emitter, the light redirecting fin including a total internal reflection surface spaced apart from the transverse reference plane and including a secondary refracting surface, the secondary refracting surface of the light redirecting fin extending at an acute angle from the distal end of the total internal reflection surface to an intersection with the transverse reference plane;

wherein the total reflection surface of the light redirecting fin is configured to reflect light incident on the total internal reflection surface toward the desired illumination region, wherein at least a portion of the light reflected by the total internal reflection surface passes through the secondary refracting surface, wherein the desired illumination region is on the first side of the transverse reference plane and wherein the desired dark region is on the second side of the transverse reference plane wherein the total internal reflection surface of the light redirecting fin is positioned at varying distances from the transverse reference plane such that a proximal portion of the total internal reflection surface is farther from the reference plane than a distal portion of the total internal reflecting surface; the total internal reflection surface comprises a plurality of planar longitudinal faces, each face having a proximal edge and a distal edge, each respective distal edge of a longitudinal face closer to the transverse reference plane than the respective proximal edge of the longitudinal face.

* * * * *